United States Patent [19]

Beckenbaugh et al.

[11] 4,268,536

[45] May 19, 1981

[54] METHOD FOR DEPOSITING A METAL ON A SURFACE

[75] Inventors: William M. Beckenbaugh, East Amwell Township, Hunterdon County, N.J.; Patricia J. Goldman, Naugatuck, Conn.; Ted D. Polakowski, Jr., Bergenfield Township, Bergen County, N.J.

[73] Assignee: Western Electric Company, Inc., New York, N.Y.

[21] Appl. No.: 108,996

[22] Filed: Jan. 2, 1980

Related U.S. Application Data

[63] Continuation-in-part of Ser. No. 967,549, Dec. 7, 1978, abandoned.

[51] Int. Cl.³ .............................................. B05D 3/06
[52] U.S. Cl. ..................................... 427/54.1; 427/92; 427/98; 427/443.1; 430/417; 430/315
[58] Field of Search .............. 427/54.1, 92, 98, 430 A; 430/417

[56] References Cited

U.S. PATENT DOCUMENTS

| | | |
|---|---|---|
| 3,615,560 | 10/1971 | Jonker et al. |
| 3,772,056 | 11/1973 | Polichette et al. .................. 430/417 |
| 3,772,078 | 11/1973 | Polichette et al. |
| 3,907,621 | 9/1975 | Polichette et al. .................. 427/304 |
| 3,925,578 | 12/1975 | Polichette et al. .................. 427/304 |
| 3,930,963 | 1/1976 | Polichette et al. .................... 427/98 |
| 3,933,802 | 11/1976 | Polichette et al. .................... 427/98 |
| 3,994,727 | 11/1976 | Polichette et al. .................... 427/98 |
| 4,084,023 | 4/1978 | Dafter .............................. 427/54.1 |
| 4,098,922 | 7/1978 | Dinella et al. ...................... 427/54.1 |

FOREIGN PATENT DOCUMENTS 1578331  7/1969  France .

*Primary Examiner*—John H. Newsome
*Attorney, Agent, or Firm*—J. F. Spivak

[57] ABSTRACT

The method of depositing a metal on a surface especially suitable for the manufacture of printed circuit boards includes coating the surface with a sensitizing solution comprising an inaqueous solvent solution, a reducible salt of a non-noble metal, a salt of 2,7 anthraquinone disulfonic acid and a polyol type secondary reducing agent such as sorbitol. The coated surface is then dried and the dried surface may be stored for extended periods of time before further processing which consists of imaging the sensitized surface with ultraviolet light and electrolessly plating a metal over the imaged surface.

9 Claims, 1 Drawing Figure

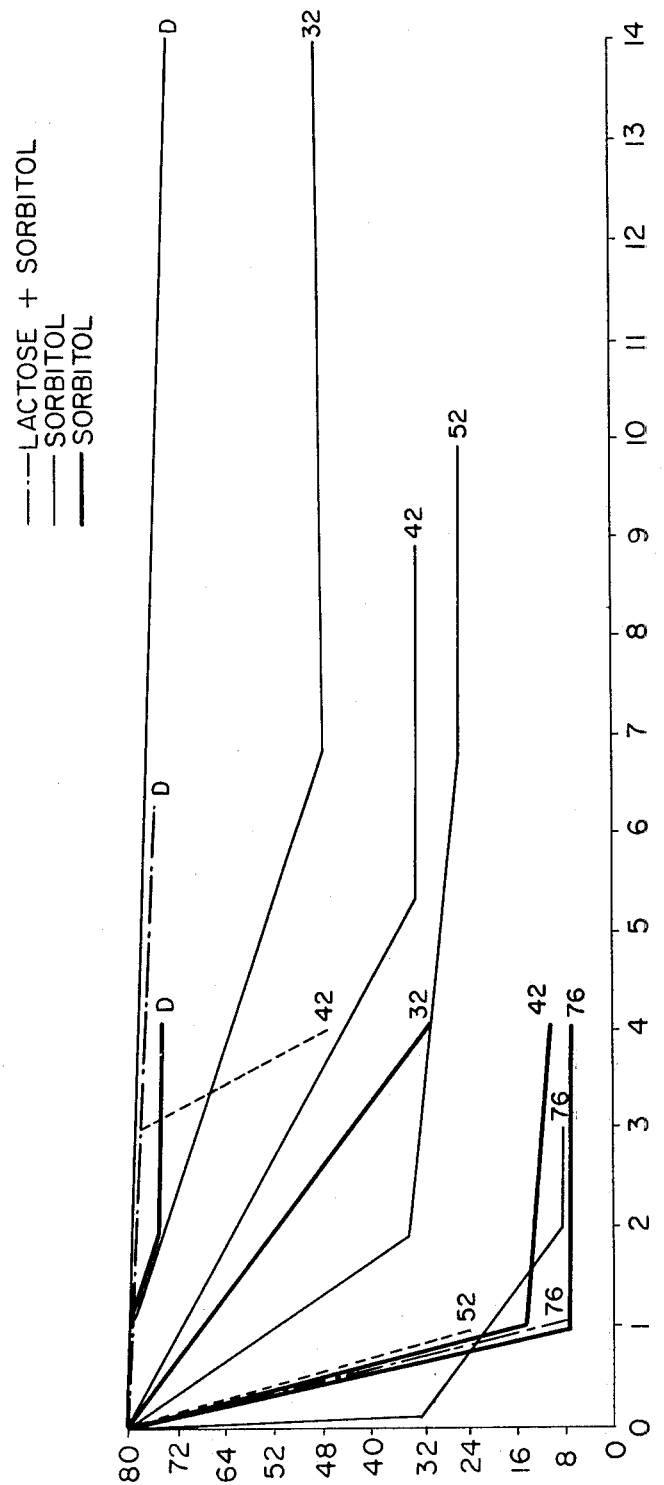

METHOD FOR DEPOSITING A METAL ON A SURFACE

This is a continuation in part of Ser. No. 967,549 filed Dec. 7, 1978 now abandoned.

TECHNICAL FIELD

This invention relates to a method of depositing a metal on a surface and more particularly, to a method of selectively depositing an electroless metal deposit on a surface.

BACKGROUND OF THE INVENTION

Heretofore, it has been known to employ a number of pretreatment or sensitization baths in effecting the electroless deposition of metals on various surfaces. Typically, such prior art sensitization baths used commercially have been expensive because they depend upon a noble metal, e.g., Pd, Pt, Ag, Au, etc., as the catalytic component for electroless deposition. However, more recently, methods have been reported in which electroless metal deposits can be applied to a broad variety of insulating substrates without the need to use expensive noble metals. These recent methods employ reducible salt compositions of non-noble metals. Examples of such methods can be found with reference to U.S. Pat. Nos. 3,772,056; 3,772,078; 3,907,621; 3,925,578; 3,930,963; 3,993,802; and 3,994,727. A problem with the methods disclosed in these patents and not recognized or addressed thereby or therein is the storage time generally required after sensitization of the substrate. Typical storage times of these prior art methods of a substrate having a sensitized surface thereon, prior to imaging of that surface, is in the order of hours. During production of printed wiring boards, however, one often encounters the need for a significantly longer storage time between the step of sensitizing the substrate surface and imaging that surface to obtain a pattern thereon. This requirement generally comes about due to the fact that the imaging processing step is generally much more time consuming than the step of forming the sensitized surface on the substrate, which latter step can be performed in large batches. There is therefore often a backup and holding or inventory period between the formation of the sensitized substrate and the imaging and further processing thereof. Consequently, it is a requirement during actual commercial use of such processes to have a sensitized substrate which can be stored for several days without degradation of the sensitization layer. It is desirable to maintain storage capabilities of at least 7 days.

Recently issued U.S. Pat. No. 4,098,922 does address itself, in part, to the aging or storage problem. The solution to the problem proposed therein is the use of lactose in the formulation without drying the sensitizing solution. It has been found, however, that imaging requires a certain amount of moisture and if this moisture is not present, no or little imaging occurs. Since lactose does not retain any significant quantity of water, lactose alone is only suitable when imaging is performed in high humidity conditions, e.g., greater than 75% humidity. Where the humidity is 75% or less, then another, water retaining polyol may be used in combination with the lactose. However, in this instance, shelf lives of only 1–2 days can be expected in humidities of about 50–70%.

The prior art suggests sensitization solutions including many possible alternative compounds and compositions. More particularly, the aforementioned patents suggest dozens of compounds, which are recognized only as mere alternatives, e.g., compounds selected from ferric salts, bichromate salts and anthraquinone and its derivatives. Included as a mere alternative are salts of anthraquinone 2,7 disulfonic acids. The prior art, however, does not recite any specific example employing this compound. We have surprisingly found that this one specific derivative of anthraquinone disulfonic acid, when used in combination with the other ingredients of the sensitization solutions previously disclosed, results in a sensitized layer having much longer storage times without degradation than that resulting from the use of prior art solutions and methods in almost any humidity conditions.

SUMMARY OF THE INVENTION

A method of depositing a metal on a surface includes coating the surface with a sensitizing solution comprising, in an aqueous solvent system, a reducible salt of a non-noble metal, a primary reducing agent consisting of 2,7 anthraquinone disulfonic acid or the alkali metal salts thereof, and a secondary reducing agent which is capable of retaining an amount of moisture sufficient to induce imaging under exposure to u.v. light.

BRIEF DESCRIPTION OF THE DRAWINGS

The FIGURE is a graphical representation of the effect of time between drying the sensitizing coating and imaging the coating upon the percent conversion of copper at various conditions of humidity.

DETAILED DESCRIPTION

The present invention will be discussed primarily in terms of selectively depositing copper on a surface of an apertured substrate, and more particularly, in terms of making printed wiring boards. It will be readily appreciated that the inventive concept is equally applicable to depositing other suitable metals which are catalytically reduced from their respective ions by the catalytic surface areas produced by the subject invention. It will also be appreciated that the selective deposition is not limited to any one particular type of surface but is applicable to metallizing any surface, whether used as a printed circuit board or not.

The present invention relates to forming by radiant energy sensitive, metallic areas on the surfaces of a substrate which catalyze the deposition of strongly adherent and continuous deposits of electrolessly plated metal. The aforementioned U.S. patents, all of which are incorporated herein by reference, disclose a method of selectively metallizing a surface by coating with a composition comprising at least a reducible salt of a non-noble metal selected from copper, nickel, cobalt or iron, which is then converted to electrically non-conductive metal nuclei capable of catalyzing the deposition thereon of a metal from an electroless metal deposition solution. These references further disclose the combination of such a non-noble metal salt in an aqueous media together with a primary reducing agent and a secondary reducing agent. Included in the primary reducing agents disclosed in the specific examples of these references is anthraquinone 2,6 disulfonic acid and the sodium or disodium salts thereof. It has been found, when employing solutions containing 2,6 anthraquinone disulfonic acid or its salts as disclosed in the Polichette patents, the resultant sensitized surface only retains its sensitivity, especially in the presence of humidities of 50% or above, in the order of several hours. After the passing of several hours, the ability of the sensitizing solution to form active catalytic sites for electroless deposition upon imaging decreases rapidly and the resultant electroless deposition is either non-uniform, fraught with defects, or after the passage of sufficient time in such an environment, such as more than two to three days, little or no electroless deposition occurs due to a lack of catalytic sites. Surprisingly and unexpectedly, this problem is obviated when 2,7 anthraquinone disulfonic acid or the alkali metal salts (e.g., sodium salts) thereof or mixtures thereof are substituted for the 2,6 anthraquinone disulfonic acid of the prior art. It has been found that with this substitution, sensitized substrates can be stored prior to imaging for periods of about 7 days in humidities greater than 95% and for about 14 days or more in humidities of about 95% or less while still maintaining highly catalyzed image surfaces which are capable of being electrolessly plated to form good continuous plating patterns. The reason for the observed effect of 2,7 anthraquinone disulfonic acid or sodium salts thereof as compared with the 2,6 L anthraquinone disulfonic acid of the prior art is not known or understood nor was it expected nor could it be predicted from the prior art.

In practicing the novel method, a suitable substrate is first selected. Typical suitable substrates include bodies comprising inorganic and organic substances such as glass, ceramics, porcelain, resins, paper, cloth and the like. Epoxy coated metal or unclad substrates of the type described may also be used.

For printed circuit boards, among the materials which may be used as the substrate, are generally metal-clad or unclad insulating thermosetting resins, thermoplastic resins, and mixtures of the foregoing, including fiber, e.g., fiberglass, impregnated embodiments of the foregoing, resin-clad metals and resin-clad glass. The invention is particularly applicable to the metallization of resin impregnated fiber structures, varnish coated, resin impregnated fiber structures and resin coated steel substrates, e.g., epoxy coated steel.

Since ultraviolet radiation is employed in imaging the desired circuit pattern in accordance with the method to be described, preferred substrates are opaque to the transmission of radiant energy. This prevents "printing through" and also facilitates simultaneous or sequential formation of images and circuits on both major surfaces of a printed circuit board.

When the selected substrate contains an aperture or through hole as is typically found in printed circuit boards, the sensitizing solution preferably includes a low molecular weight alcohol as described in the aforementioned U.S. Pat. No. 4,098,922.

If desired, the substrate surface can be coated with an adhesive before being coated with compositions of this invention.

In general, the method involved in making a printed wiring board, starting with a substrate such as a polymer coated metal substrate, comprises the steps of pretreating the substrate surface to make it more susceptible for treatment with the sensitizer solution, coating the substrate with sensitizer, drying the coated surface, imaging the desired pattern onto the sensitized surface by means of ultraviolet radiation so as to form catalytic sites for electroless deposition in the imaged areas, cleaning the substrate to remove unused and unimaged sensitizer and treating the substrate in an electroless plating bath for the formation of an electroless metal deposit thereon. It should be understood that between the steps of drying the sensitized coating on the substrate and imaging, there is often a delay where the substrates must be stored for at least several days prior to imaging.

Typical pretreatment of the substrate prior to sensitization includes the steps of swell-etching with methyl ethyl ketone swellant followed by treatment with a chromic oxide, sulfuric acid, phosphoric acid mixture etchant. Suitable swell-etch pretreatment procedures and solutions can be found with reference to U.S. Pat. No. 4,098,922.

Typical sensitizing solutions comprise aqueous solutions of a reducible metal salt, e.g., copper formate, together with 2,7 anthraquinone disulfonic acid or the sodium salts thereof or mixtures of the salts with the acid as a primary reducing agent and a secondary reducing agent. As aforementioned, it is preferred that when apertures are present in the printed wiring board the solution also contain a low molecular weight alcohol such as alcohols in the homologous series of ethanol through octanol. In one manner of proceeding, an aqueous sensitizing solution comprising a reducible metal salt composition such as cupric formate, the disodium salt of 2,7 anthraquinone disulfonic acid which is a radiant energy sensitive reducing agent, and a secondary reducing agent such as sorbitol, is selectively printed on the surface of a pretreated substrate, dried and exposed to a source of radiant energy such as an ultraviolet radiation source to form a real image of catalytic metallic nuclei. Alternatively, the sensitizing solution can be applied to the entire surface of the printed wiring board and imaging done through a mask depicting the desired circuit board pattern so as to form catalytic nuclei in a pattern in accordance with the imaging mask.

The 2,7 anthraquinone disulfonic acid and its alkali metal salts used in association with the reducible metal has the property of decomposing under u.v. light to a compound which will exercise a reducing action on the exposed metal salt. Use of the particular anthraquinone disulfonic acid derivatives set forth above results in a stable sensitized surface that can be imaged a week or more after sensitization to form a catalyzed surface which promotes a continuous, sharp, electroless deposit essentially free of defects and voids.

The reducible metal salt can comprise, in general, a cation selected from the metals of Group VIII and IV of the Periodic Table of the Elements. The anion associated in such metal salts can vary widely and can comprise organic or inorganic ions such as halides, sulfates, nitrates, formates, gluconates, acetates and the like. The cations in such salts will include copper, nickel, cobalt and iron, in any of the usual degrees of oxidation, e.g., both cuprous and cupric, ferrous and ferric, etc., will serve. Some typical salts include cupric formate, cupric gluconate, cupric acetate, cupric chloride, cupric nitrate, nickel chloride, cobalt chloride, ferrous sulphate and cobalt chloride. It is preferred, for printed circuit boards in particular, to use reducible metal salts of copper, e.g., copper formate.

An additional ingredient in the sensitizing composition is a secondary reducing agent, such as an organic, oxygen or nitrogen containing compound. Such an ingredient serves to facilitate interaction of radiant energy and the radiant energy sensitive 2,7 anthraquinone disulfonic acid to provide a reduction of the metal salt to the free metal nuclei. Although the secondary reducer compound may be any oxidizable organic compound which is soluble in the solution, does not attack the base material, and is inert to the other ingredients, it is preferred that it comprise a hydroxyl compound such as an alcohol, a polyol or a sugar. Especially preferred as secondary reducing compounds are alcohols, sugars or polyols. Among the organic oxygenated compounds can be mentioned glycerol, ethylene glycol, pentaerythritol, mesoerythritol, 1,3 propanediol, sorbitol, mannitol, 1,2 butanediol, xylitol, pinacol, sucrose, fructose, glucose, dextrin, polyethylene glycols, lactose, starch, gelatin, and the like. Also included are compounds such as triethanolamine and propylene oxide. Compounds which are also useful as secondary reducers are amino compounds, polyethers, certain dye stuffs and pigments.

It is pointed out hereat that it has been discovered that in order for imaging to occur, that is in order for the reducible metal ion to be reduced upon exposure to ultraviolet light, either the secondary reducing agent must contain a certain amount of water in order to initiate the imaging reaction, or in the alternative, imaging must be performed in a high humidity atmosphere. Since it is preferred for commercial applications, to operate at usual room environment humidities, it is therefore preferred to utilize a secondary reducing agent which has the ability to contain an amount of water sufficient to initiate the chemical reaction leading to the reduction of the non-noble metal catalytic ion. It has been found therefore, for operation at humidities of below about 70%, use of lactose alone is not preferred since an insufficient amount of water is contained in the lactose. On the other hand, however, a preferred secondary reducing agent, e.g., sorbitol or xylitol, is one which has the ability to contain a sufficient amount of moisture to initiate the reaction, while at the same time not containing excessive amounts of moisture so as to cause any detrimental effects with respect to the 2,7 anthraquinone disulfonic acid type sensitized surface.

Additionally, other ingredients known as metal reduction intensifiers/accelerators/stabilizers may be added to the sensitizing solution to provide at least one of the following effects: (1) speed up the exposure time, (2) help bring out image contrast, (3) provide anti fogging, (4) lead to better definition, (5) prevent image fading, and (6) minimize heat sensitivity. Compounds useful for these purposes have been described in the aforementioned prior art. Illustrative of such compounds are: hydrogen halides and alkali metal or alkaline earth metal halides, ammonia or amine halides and the like. Specific examples of such materials can be found with reference to the aforesaid prior art, e.g., U.S. Pat. No. 4,098,922. As pointed out in the art, a particularly effective additive is ferrithiocyanide compounds.

In addition to the metal reduction image intensifiers/accelerators/stabilizers, the composition comprising the sensitizing solution can also include a surfactant for those surfaces which are hard to wet with the particular sensitizing solution employed. The choice of surfactant is not particularly critical, but usually it is preferred to use a non-ionic surfactant since this permits a broader range in formulation. Among the suitable surfactants are polyethyleneoxy non-ionic ethers such as Triton-X100, manufactured by Rohm and Haas Company. Many other useful surfactants are well known in the art.

The treating sensitizing solution may be formulated within broad concentration ranges, depending primarily on the relative amount of metal salt composition desired to be placed on the surface to be catalyzed, which in turn will depend upon the mode of application, e.g., immersion, dip coating, roller coating, curtain coating, spraying and the like. In addition, the concentration of the ingredients in solution will be limited by solubility in the solvent. In general, the metal salt concentration will be predetermined and the amounts of radiant energy sensitive compound and other ingredients, if present, will be adjusted to provide a ratio which will insure the desired result. This is well within the skill of those familiar with the art of formulating radiant energy sensitive systems. For example, at least enough radiant energy sensitive compound (2,7 anthraquinone disulfonic acid or its alkali metal salts or combinations thereof) should be present to facilitate substantially complete reduction by exposure to radiant energy of the metal salt to the free metal nuclei. Usually to insure complete reduction, a substantial excess of the radiant energy sensitive compound (based on the reducible metal ions) will be present. The metal salt concentration in solutions can vary over wide limits, e.g., from 0.5 to 100 grams or more per liter can be used but it is most convenient and economical not to use more than about 25 grams per liter and preferably less than about 15 grams per liter. The 2,7 anthraquinone disulfonic acid or its salts can comprise from about 1 to 10 or more equivalents, based on the metal salt. The amount of secondary reducer, such as sorbitol, can likewise vary over a wide range, e.g., from 0.5 to 500 grams per liter, but in the case of difficult to volatilize liquid compounds, it is preferred not to include so much of such compounds that the treated surface is wet or sticky to the touch after drying. The ingredients, such as halide ions, stannous halides and carboxylic acids which may be added to the compositions as image intensifiers, accelerators and stabilizers, will generally be used in relatively low concentrations, e.g., from trace amounts, e.g., from about 1 milligram per liter up to about 2 grams per liter. The amount of ferrithiocyanide compounds range from 50 to 150 parts per million. Surfactants will be used in small, but conventional quantities, if present. Non-ionic surfactants generally will be used at levels from abbout 0.1 to 2 grams per liter and anionic surfactants generally from about 0.1 to 1.0 grams per liter.

For comparative purposes, time and humidity studies were performed using prior art aqueous sensitizing solutions containing the disodium salt of 2,6 anthraquinone disulfonic acid with sorbitol (Example I) and a combination of sorbitol and lactose (Example II) as primary and secondary reducing agents, respectively. These sensitizers were compared with sensitizers employing the disodium salts of 2,7 anthraquinone disulfonic acid alone (Example III) and in combination with the 2,6 derivative (Examples IV–VI).

EXAMPLE I

Substrates comprising a steel core with a fully cured diglycerol ether of bisphenol A epoxy coating thereon were selected. The substrates, suitable for printed circuit boards comprised a plurality of through holes. The substrates were immersed in a solvent bath comprising methyl ethyl ketone for 10 minutes at 25° C. The substrates were then water rinsed for 1 minute at 25° C. and then etched in an aqueous solution comprising 360 grams of $CrO_3$, 250 grams of $H_3PO_4$ and 180 grams of $H_2SO_4$ in 1,000 milliliters of water, maintained at 25° C. for 10 minutes. The etched substrates were then water rinsed at 25° C. for 10 minutes. The above is hereinafter referred to as the pretreatment step.

A sensitizing solution was prepared by dissolving 21 grams of cupric formate, 16 grams of the disodium salt of 2,6 anthraquinone disulfonic acid, 66 grams of sorbitol, 50 grams butanol to 1,000 milliliters in water. The etched substrates were immersed in the sensitizing solution for 1 minute at 25° C., removed therefrom and dried at 90° C. for 3 minutes. The amount of copper present was determined by X-ray fluorescence. The substrates were then stored at 25° C. under various controlled humidities and times. After the predetermined storage time elapsed for each substrate, a surface of the dried substrate was selectively exposed, through an imaging mask, to a high pressure mercury zenon discharge lamp at ambient temperature and humidity for 90 seconds to form a real image. The exposed surface was rinsed in an alkaline cleaning solution comprising formaldehyde, potassium ferricyanide, sodium hydroxide and EDTA followed by a rinse in deionized water for 1 minute. Subsequent to the deionized water rinse the surface is then dipped in an acetic acid solution which hardens and fixes the image and further removes any uncatalyzed copper still remaining on the surface. Prior to electroless plating, another rinse in deionized water is used and the amount of imaged copper was determined by X-ray fluorescence techniques. Finally, the imaged substrate was immersed in an electroless metal deposition solution comprising cupric sulphate, formaldehyde, potassium ferrocyanide, sodium hydroxide, EDTA, mercuric acetate and phenyl mercuric acetate. A 0.08 mil thick electroless copper pattern corresponding to the real image is generally deposited in 15 minutes on substrates having at least a 60% conversion of copper species to catalytic copper which is equivalent to at least about 2 gm./cm² of catalytic copper on the substrate surface. If the copper level declines below the minimum, no electroless plating or discontinuous plating results.

EXAMPLE II

The procedure set forth in Example I was repeated except that the secondary reducing agent in the solution consisted of 50 grams sorbitol plus 50 grams α-lactose.

EXAMPLE III

Essentially the same procedure as set forth in Example I was repeated except that the sensitizing solution contained 26.9 g/l cupric formate, 100 g/l sorbitol, 50 g/l butanol and 16 g/l disodium 2,7 anthraquinone disulfonic acid.

EXAMPLE IV

The same procedure set forth in Example III was repeated except that a mixture of disodium 2,7 anthraquinone disulfonic acid (12 g/l) and 2,6 anthraquinone disulfonic acid (4 g/l) was employed in the sensitizing solution.

EXAMPLE V

The same procedure set forth in Example III was repeated except that 16 g/l of an equi-weight mixture of the aforesaid 2,6 and 2,7 anthraquinone derivatives was employed in the sensitizing solution.

EXAMPLE VI

The same procedure set forth in Example III was repeated except that 16 g/l of a 1:4 weight percent mixture of the aforesaid 2,7 anthraquinone derivative to the 2,6 anthraquinone derivative was employed in the sensitizing solution.

EXAMPLE VII

The same procedure as set forth in Example III was followed except that the sensitizer contained 16 g/l of the 2,6 anthraquinone derivative and no 2,7 anthraquinone derivative.

The sensitized boards from Examples III-VII were stored at 90° F. and 90 percent relative humidity.

The results of experiments performed in accordance with Examples I and II are shown with reference to the graphs shown in the FIGURE. The abscissa of the graphs represents the storage time between sensitization and imaging, in days at room temperature and under various relative humidities. The ordinate of these graphs indicate the relative conversion of copper deposited during sensitization to catalytic copper obtained after imaging and fixing. The letter D in the FIGURE refers to sensitized substrates stored in a desiccant or at an essentially zero relative humidity between the time of sensitization and the time of imaging. The numerals adjacent each of the other graphs of the FIGURE refer to the relative humidity at which samples were stored between sensitization and imaging in deriving each of the respective curves. Three sets of graphs are shown, one set (using dashed lines) represents an indication of relative conversion of copper deposited at various relative humidities, as indicated, and various storage times subsequent to sensitization for formulations containing both lactose and sorbitol therein. The other sets of curves represent similar information obtained from experiments where lactose was not included in the sensitizer formulation.

The results of experiments performed in accordance with Examples III-VII are given in the Table below.

| Storage Time | % Disodium 2,7 anthraquinone disulfonic acid | | | | | |
|---|---|---|---|---|---|---|
| | % Disodium 2,6 anthraquinone disulfonic acid | | | | | |
| | 100%/ 0 | 75/ 25 | 50/ 50 | 25/ 75 | 0/ 100 | |
| 0 | 79 | 84.5 | 86.5 | 86.5 | 85 | % Conversion |
| 1 hr. | 80.5 | 82.5 | 87.5 | 79 | 35 | of copper |
| 2 hrs. | 78.5 | 89.5 | 92.5 | 92 | 55 | to |
| 3 hrs. | 85 | 85 | 83 | 67.5 | 39.5 | catalytic |
| 4 hrs. | 79 | 79 | 74 | 62 | 38.5 | copper |
| 0 days | 78 | 78.5 | 81 | 78.5 | 79.5 | |
| 1 day | 79 | 81 | 67.5 | 45.5 | 26.5 | |
| 5 days | 77.5 | 77.5 | 64 | 38 | 27.5 | |
| 10 days | 77 | 78 | | | | |
| 14 days | 77 | 77 | | | | |

As previously stated, at least about 60% conversion of copper to catalytic copper is required to obtain reproducible continuous plating. It can therefore be seen from the series of curves shown in FIG. 1 that at relative humidities of greater than about 32% maximum room temperature storage time employing the prior art disodium salt of 2,6 anthraquinone disulfonic acid is generally less than 2-3 days with sorbitol alone as the secondary reducing agent. At relative humidities of 42% or more, the maximum room temperature storage time has been found to be from about ½ day to about 2 days and generally less than 1 day in the presence of sorbitol alone as the secondary reducing agent and less than 4 days with a sorbitol-lactose mixture in the sensitizing solution. Generally, the higher the temperature, as well as the higher the humidity, the shorter the maximum storage time employed with the disodium 2,6 anthraquinone disulfonic acid as the sole reducing agent in the sensitizing solution.

In comparison, it can be seen from the above Table that storage times of up to at least 14 days can be obtained with sensitizing solutions employing the 2,7 anthraquinone disulfonic salt in relative humidities and temperatures as high as 90% and 90° F. respectively, In fact, 50-50 mixtures of the 2,6 and 2,7 derivatives also yield suitably sensitized surfaces after storage in these extreme conditions for up to 5 days.

Another unexpected but commercially important result observed upon changing from sensitizing solutions containing the 2,6 anthraquinone disulfonic acid salt to solutions containing the 2,7 anthraquinone disulfonic acid salt is the fact that the former solutions were highly time-temperature sensitive during the drying process. In these prior art solutions, if drying time at 90° C. significantly exceeded 3 minutes or if the drying temperatures exceeded about 95° C., the coating was desensitized in that the continuous catalytic copper layer could not be formed upon imaging and fixing. In contrast, sensitizing solutions employing the 2,7 anthraquinone disulfonic acid salts are relatively insensitive to time and temperature of drying and no adverse affects were observed with drying times of 15 minutes at temperatures of up to 100° C.

For comparison purposes, the following Table is presented of experimental results showing the percent conversion of copper to catalytic copper as a function of drying temperature and drying time for drying sensitizing solutions prepared in accordance with the formulation set forth in Example I and a similar formulation substituting the disodium 2,7 anthraquinone disulfonic acid for the 2,6 isomer.

| Drying Temp. | 2,6 isomer drying time (min.) | | | | 2,7 isomer drying time (min.) | | | |
|---|---|---|---|---|---|---|---|---|
| | 1 | 3 | 5 | 10 | 1 | 3 | 5 | 10 |
| | % Conversion | | | | | | | |
| °F. | | | | | | | | |
| 200° F. | 80 | 83 | 32 | 15 | 82 | 85 | 84 | 80 |
| 250° F. | 81 | 65 | 25 | 12 | 85 | 87 | 81 | 78 |

EXAMPLE VIII

A sensitizer solution is made up consisting of an aqueous solution of the following ingredients:

| | | |
|---|---|---|
| (a) | copper formate | 26 grams/liter |
| (b) | disodium 2,7 anthraquinone disulfonate | 16 grams/liter |
| (c) | sorbitol | 100 grams/liter |
| (d) | butanol | 50 grams/liter |

An epoxy coated steel printed circuit substrate is coated with the sensitizer solution by dipping the substrates in a tank of the solution at room temperature for a time of 90 seconds and then withdrawing the substrate from the tank. Preferably, the withdrawing substrates are passed between pairs of synthetic-chamois covered compression rollers as described in a related copending application of applicants D. Dinella, A. H. Haller and T. D. Polakowski, Ser. No. 32,616, filed April 23, 1979 and entitled "Roller System for Distributing Liquid Over a Surface," herein incorporated by reference. As described in that application, the compression rollers serve to apply a uniform, controllable thickness film of the sensitizer liquid to the planar surfaces of the substrate.

After dipping, the sensitizer liquid coating is dried in an oven at a temperature of 190° F. to 210° F. for a time of 2.5 to 3.5 minutes to form a dried film of the sensitizer on the substrate. The coated board may now be stored in this form for a substantial period of time, several days if desired, prior to the exposing operation.

Subsequently, the substrate with the dried film is exposed to ultraviolet radiation through a mask, such as a glass photo tool with an image photographically placed on one side, to form seed deposits or nuclei of metallic copper at the exposed sites on the surfaces of the substrate.

In accordance with the teachings of an application filed or to be filed on behalf of W. M. Beckenbaugh, D. Dinella, P. J. Goldman and T. D. Polakowski, exposure of the coated board is accomplished under U.V. radiation of 400–500 milliwatts/cm$^2$ at a temperature of 110°–290° F. (43°–148° C.) for 20–35 seconds under ambient moisture conditions equal to 120–250 grains water per pound of dry air. The boards are then processed as previously set forth.

It should be noted, as taught in the aforementioned application, which is incorporated herewith by reference, that the preferred ranges of parameters for image exposure is as follows:

(1) U.V. radiation 400–500 mw/cm$^2$, (2) ambient moisture 120–250 grains H$_2$O/pound dry air, (3) image exiting temperatures of 110°–290° F., and (4) exposure time of 20–35 seconds.

What is claimed is:

1. A method of depositing a metal on a substrate which comprises:
    (a) coating the substrate with a sensitizing solution comprising a reducible salt of non-noble metal, a primary reducing agent selected from the group consisting of 2,7 anthraquinone disulfonic acid, alkali metal salts of 2,7 anthraquinone disulfonic acid and mixtures thereof, and a secondary reducing agent;
    (b) drying the coated substrate;
    (c) storing the dried substrate for at least 3 days at relative humidities of at least 32%; and
    (d) exposing the dried substrate to ultraviolet light to form a catalytic layer.

2. The method defined in claim 1 wherein said secondary reducing agent is a polyol.

3. The method as defined in claim 2 wherein said polyol is selected from the group consisting of sorbitol and a mixture of sorbitol and lactose.

4. The method as defined in claim 1 wherein said sensitizing solution includes an alkyl alcohol having from 2 to 8 carbon atoms.

5. A method of depositing a metal on a substrate which comprises:
    (a) coating the substrate with a sensitizing solution comprising a reducible salt of a non-noble metal, a primary reducing agent selected from the group consisting of 2,7 anthraquinone disulfonic acid, alkali metal salts thereof and mixtures thereof, and a secondary reducing agent;
    (b) drying the coated substrate;
    (c) storing the dried substrate for at least one day at relative humidities of at least 42%; and (d) exposing the substrate to ultraviolet light to form a catalytic layer.

6. The method defined in claim 1 including the step of exposing said catalytic layer to an electroless metal deposition solution to deposit an electroless metal deposit thereon.

7. The method as defined in claim 5 further comprising exposing said catalytic layer to an electroless metal deposition solution to deposit an electroless metal deposit thereon.

8. The method as defined in claim 1 wherein said coated substrate is dried at a temperature of at least 95° C.

9. The method as defined in claim 1 wherein said coated substrate is dried at a temperature of at least 90° C. for times of greater than 3 minutes.

* * * * *